United States Patent [19]

Chiu et al.

[11] Patent Number: 4,677,302

[45] Date of Patent: Jun. 30, 1987

[54] OPTICAL SYSTEM FOR INSPECTING PRINTED CIRCUIT BOARDS WHEREIN A RAMP FILTER IS DISPOSED BETWEEN REFLECTED BEAM AND PHOTODETECTOR

[75] Inventors: Ming-Yee Chiu, Mt. Laurel; Edward J. Devinney, Jr., Delanco, both of N.J.

[73] Assignee: Siemens Corporate Research & Support, Inc., Iselin, N.J.

[21] Appl. No.: 717,973

[22] Filed: Mar. 29, 1985

[51] Int. Cl.$^4$ ............................................. G01N 21/86
[52] U.S. Cl. .................................. 250/560; 356/376; 250/561
[58] Field of Search ................. 356/1, 4, 376, 394; 250/205, 211 K, 560, 561, 221

[56] References Cited

U.S. PATENT DOCUMENTS

| | | | |
|---|---|---|---|
| 3,308,264 | 3/1967 | Ullery | 250/221 |
| 3,612,890 | 10/1971 | Cornyn et al. | 356/398 |
| 3,909,602 | 9/1975 | Micka | 356/394 |
| 4,005,939 | 2/1977 | Stavalone | 356/394 |
| 4,146,327 | 3/1979 | Harris | 356/4 |
| 4,240,750 | 12/1980 | Kurtz et al. | 356/394 |
| 4,373,805 | 2/1983 | Mallinson | 356/1 |
| 4,421,410 | 12/1983 | Karasaki | 356/394 |
| 4,498,778 | 2/1985 | White | 356/376 |
| 4,548,504 | 10/1985 | Morander | 356/376 |

FOREIGN PATENT DOCUMENTS 2109546 10/1982 United Kingdom .

*Primary Examiner*—David C. Nelms
*Assistant Examiner*—William L. Oen
*Attorney, Agent, or Firm*—John Francis Moran

[57] ABSTRACT

A beam (2) of collimated light is directed towards a printed circuit board (4). The light beam is displaced as reflected from a point of incidence in a path including surfaces having different heights above the printed circuit board when detected at an angle oblique to the surface. From the variation of displacement which is portional to height, the overall profile of the circuit board including components present thereon is determined along the path (56) or line (64) the beam is incident. Various photodetectors (14) are utilized and the addition of a ramp filter (58) enables a single cell integrating photodetector to provide an output intensity indicative of the displacement. An arrangement (FIG. 11) is presented for compensating for variations in surface reflectivity using normalization or feedback.

9 Claims, 19 Drawing Figures

TRANSMITTANCE

OPTICAL SYSTEM FOR INSPECTING PRINTED CIRCUIT BOARDS WHEREIN A RAMP FILTER IS DISPOSED BETWEEN REFLECTED BEAM AND PHOTODETECTOR

BACKGROUND OF THE INVENTION

The invention relates to inspection of printed circuit boards, and it relates, more particularly, to the type of inspection which reveals whether the proper components have been properly and correctly installed on the board.

In mass-production of printed circuit boards, the boards are first loaded with components and then wave soldered. It is more expensive to repair a board after soldering than before soldering. Consequently, it is hightly advantageous to examine the board before soldering to verify that the proper components are installed in their designated locations with the correct polarities.

It is known to inspect printed circuit boards by measuring the brightness profile at selected locations on the board and comparing the result obtained with a standard derived from a properly loaded board. This technique has three problems, First, it is necessary to use precisely controlled illumination to make meaningful measurements. This is complicated and expensive. Second, the brightness profile of a component will vary as a result of sample-to- sample and manufacturer-to-manufacturer variations in surface finish. The brightness profile of a component may therefore be an unreliable indication of the identity of the component. Third, it can be difficult (as in the case of Dual-In-Line-Package, DIP integrated circuits) to inspect the components for proper physical orientation and electrical polarity using brightness information alone.

One subject of the invention is to provide a device for inspecting printed circuit boards which does not require controlled illumination.

Another object is to provide such a device which is unresponsive to sample-to-sample and manufacturer-to-manufacturer variations in surface finish.

A further object is to provide an arrangement capable of ascertaining the polarity or proper electrical connection of selective components by detecting their physical orientation.

Still a further object is to provide such a device which is inexpensive and robust by virtue of simplifying the photo detection requirements.

SUMMARY OF THE INVENTION

In accordance with the invention, a beam of structured light is swept across a printed circuit board and the displacement of the reflected light beam is detected and monitored. This displacement is a function of the height of a body (such as an electrical component) located on the board.

In accordance with the invention, this height information characterizes the presence or absence of the proper component in a particular location. Since the dimensions of electrical components are standardized, sample-to-sample and manufacturer-to-manufacturer variations in surface finish do not interfere with the usefulness of the device.

In an illustrative embodiment of the inventive principles, the incident beam of light may be provided by using a pivotally movable mirror to scan the printed circuit or by a cylindrical lens to illuminate a path or strip of incident light across the profile of the circuit board on its component side. Various photodetectors may be utilized to monitor the displacement which are capable of evaluation the movement locus of light in one direction. For example, a linear array with suitable resolution may be used.

A significant simplification of the photodetector is achieved by using a ramp filter to convert light displacement along a predetermined direction into proportionate variable intensity of light. Such intensity variations are detected by a single cell detector which integrates over a light receiving area sufficient to include all displacements. Since this arrangement may be subject to variations in surface reflectivity at the location of incident light, a beam splitter and a second photodetector are used to provide compensation in two ways. A divider is used in one way to normalize the output. In a second alternative arrangement, the output of the second photodetector is used to provide feedback to provide a reflected light beam of a regulated constant intensity.

BRIEF DESCRIPTION OF THE DRAWING

The foregoing and other objects and features of this invention will be more fully understood from the following detailed description of illustrative embodiments of the invention when considered in conjunction with the accompanying drawing.

Exemplary and non-limiting preferred embodiments of the invention are shown in the drawing.

DETAILED DESCRIPTION OF PREFERRED EMBODIMENTS

Figure 1:
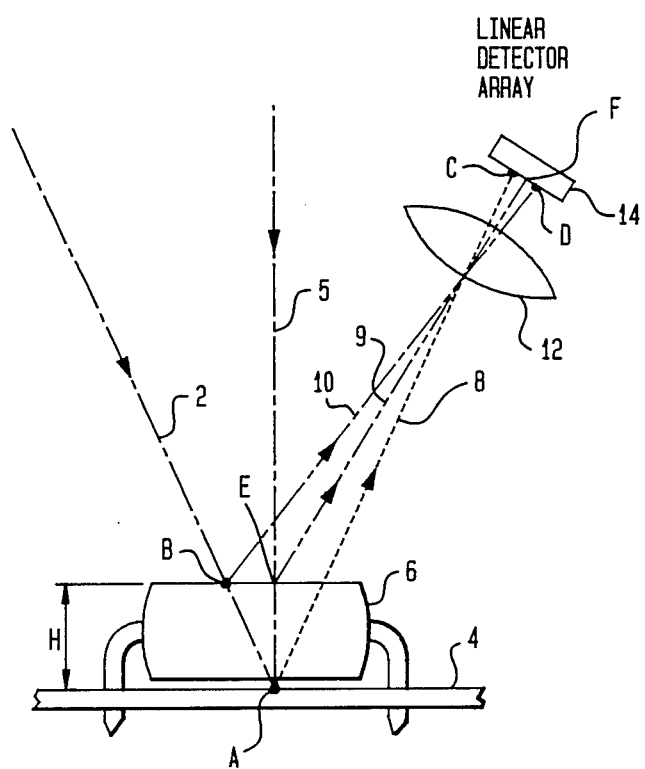
FIG. 1 illustrates the basic theoretical foundation of the invention.

In FIG. 1, the theoretical basis of the invention is illustrated. Corresponding elements are designated with same reference numerals throughout drawing Figures. A beam 2 of collimated light is directed toward a surface of a printed circuit board 4 on which a component 6 (here, e.g. a resistor) is placed.

The beam 2, which is directed obliquely, is reflected from any surfce upon that it is incident. For example, when the beam 2 strikes the printed circuit board 4 at point A, it is reflected along line 8. When the beam 2 moves back relative to circuit board 4 and is incident upon the resistor 6 at point B, the beam follows a different path and is reflected along line 10. The amount of such a change inpath direction becomes a displacement that is a function of the height H above the board 4 of the surface struck by the beam 2.

A lens is positioned to image all the expected displaced reflected beams 8 and 10 onto a detector generally indicated by reference numeral 14. Detector 14 is a suitable linear detector array. In FIG. 1, the deflected beam 8 is imaged to point C on the detector 14; the deflected beam 10 is imaged to point D on the detector 14. To accomplish this, the lens 12 has a depth of field which is sufficient to cover the entire expected range of heights.

The point on the detector 14 to which a reflected beam is images is thus an accurate representation of the height H of a surface from which the reflection occurs in accordance with the triangulation geometry between the light beam and the detector. By suitable selection of the detector 14, it is possible to resolve the height of a component with adequate precision. One suitable detector 14 is a linear array, such as a $512 \times 1$ charge-coupled device detector. The detector 14 does not need to be two-dimensional because the incident beam 2 and the reflected beam are coplanar.

A variation in this basic approach is also illustrated in FIG. 1 with a light beam 5 which is directed to be incident on the surface of printed circuit board 4 at a normal angle. In this case, the beam 5 impinges also a point E, but now scattered light depicted by ray 9 is directed toward detector 14 and images on to point F to the detector. This also produces a displacement which from the geometry of the arrangement may be used to measure H. An advantage of using a normally oriented light beam with respect to the plane of the circuit board 4 is that shadows are minimized making the inspection technique suitable for high component density on the board.

A preferred embodiment will now be discussed with reference to FIGS. 2 and 3. An X-Y stage 16 is provided above the plane of the drawing on which may be placed printed circuit boards such as 41, 42, and 43 in a dashed line outline. Each of the boards 41, 42, and 43 supports components such as 51, 52, and 53.

To inspect the printed circuit boards 41, 42, and 43, a beam 2 of collimated light is directed on their component sides, i.e. on the sides on which components are mounted. Beam 2 in this case is conventionally provided by a laser 18, but coherent light is not required and it is only necessary that the beam 2 of light be collimated. To direct the beam 2 onto the printed circuit boards 41, 42, and 43 and to detect displacement of the beam 2 caused by the components 51, 52, and 53, movable apparatus best illustrated in FIG. 3 is used. In this apparatus, a carriage 20 is secured to the stage 16 and is movable with respect to the stage 16 along the X direction. A support 22 is in turn secured to the carriage 20 and is movable with respect to the carriage 20 in the Y direction. A mirror 24 is mounted to the bottom of the carriage 20 at an angle of 45° with respect to the X-Y plane and the beam 2 of light is incident upon it from the X direction. This causes the beam 2 to be reflected in the Y direction regardless of the position of the carriage 22 with respect to the stage 16 and the source 18. The beam 2 is then directed directly by a mirror 26, which causes beam 2 to approach the stage (and any printed circuit board thereon) at right angles. This reduces the effects of shadows cast by other components on the printed circuit board.

The displaced reflected beam 2d is reflected off a mirror 28 which is fixed with respect to the support 22 that moves with it. It should be understood that mirror 28 is optional in nature, but it does serve the purpose providing a low "observation angle" for detector 14 while reducing the space required between the location of mirror 26 and the detector. The beam 2d is then passed through a focusing lens 12 and imaged on a 512'1 CCD photodetector 14. Advantageously, the lens 12 and the photodetector 14 are mounted in a housing 31 which is fixed to the support 22.

In operation, the carriage 20 is positioned at such a location that height information from the photodetector 14 is meaningful. The source 18 is energized if it is not already turned on, and the support 22 is moved along the Y direction from one end of the stage 16 to the other. The information from the photodetector 14 is then analyzed to determine if the board(s) contains the proper components in the locations scanned. The carriage 20 is then moved to the next position and the scanning process is repeated. This continues until the scanning is finished.

Only a relatively small part of the cells in the photodetector 14 are in use at any one time, since the deflected beam is advantageously as tightly focused as possible. Since this is the case it is advantageous to compress the information from the photodetector as much as possible. This can be accomplished by integrating the output of the photodetector 14 along the X direction. This can be carried out by using a lens 12 with a cylindrical shape.

Figure 4A:
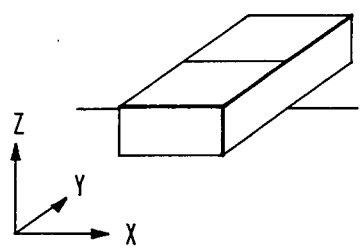
FIGS. 4, 5 and 6 illustrate the manner in which a preferred embodiment develops a response to different electrical components and each having a particular physical shape.

FIG. 4a illustrates the illumination of a rectangular component on a planar surface. Such illumination may be provided in a line by a fan beam of light or by scanning with a spot beam of light.

Figure 4B:
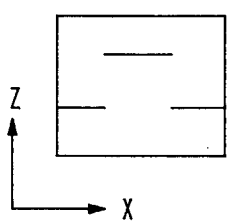
Figure 4C:
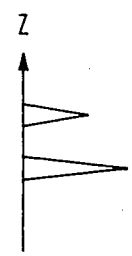
Figure 5A:
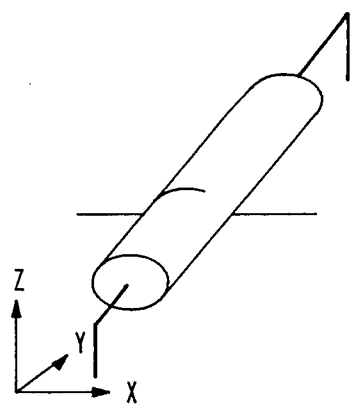
Figure 5B:
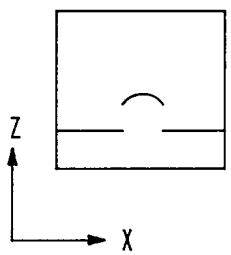
Figure 5C:
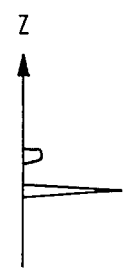

FIG. 4b shows the light displacement pattern produced on a planar photodetector, and the effect of integrating light intensity along the x-direction for the detector is depicted in FIG. 4c.

Figure 6A:
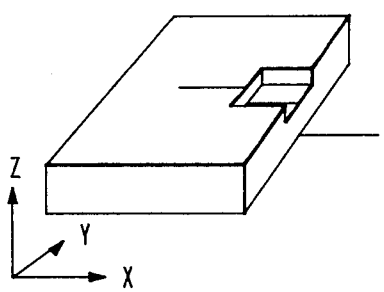
Figure 6B:
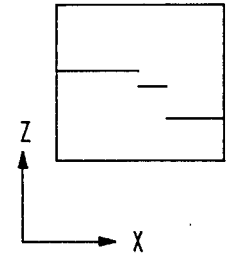
Figure 6C:
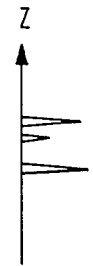

In FIGS. 5a, 5b, and 5c and FIGS. 6a, 6b, and 6c similar results are respectively depicted for a cylindrical object and a keyed object. It should be noted that the integrated detector in each case produces a different output which is capable of distinguishing the shape of the object during inspection. In FIG. 6A by scanning the component whee the key is located, the proper physical orientation is determined to ascertain correct electrical polarity in the case of a two terminal component or proper electrical connection as here, in the case of multi-terminal integrated circuit.

Figure 2:
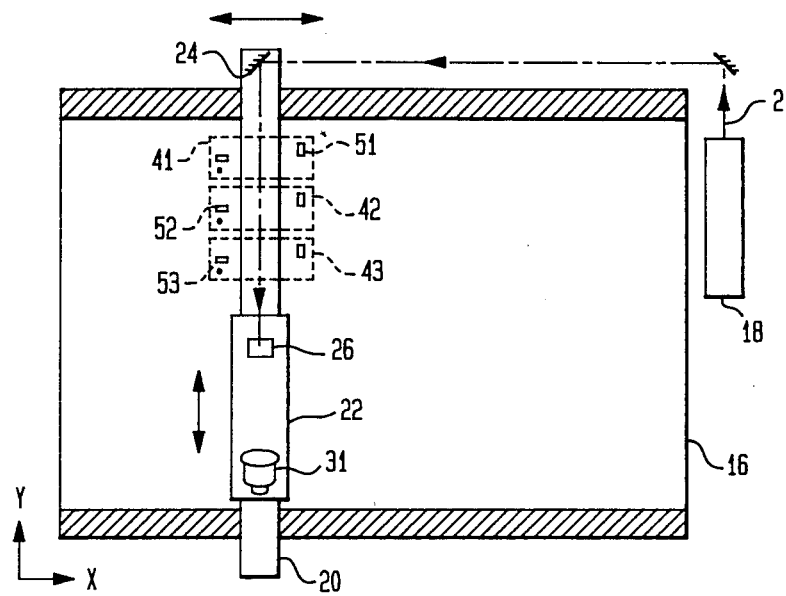
FIG. 2 depicts a preferred embodiment of the invention utilizing the inventive principles in a printed circuit board inspection application.
Figure 3:
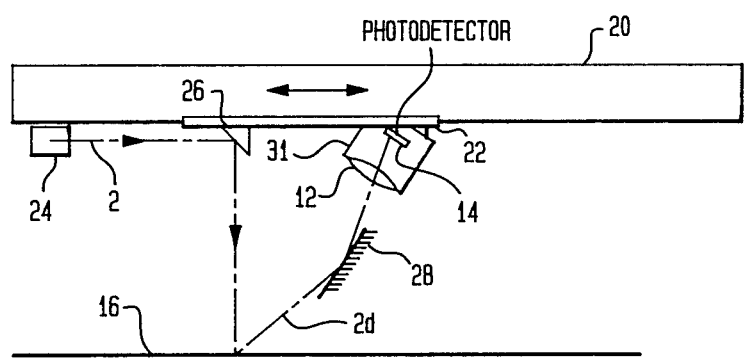
FIG. 3 is a schematic detailed view of a portion of the embodiment of FIG. 2.

In FIGS. 2 and 3 motion in both the x and y is required to scan the surface area of a printed circuit board to provide automatic inspection. The path of the light beam in FIG. 3 from mirror 26 to light detector 14 falls within a single plane which may be advantageous when inspecting printed circuit boards with high component density thereon. However, an alternate arrangement using a scanning mirror as shown in FIG. 7 eliminates the requirement of two directional orthogonal movement since now the light beam is directed to scan the printed board surfaces.

Figure 7:
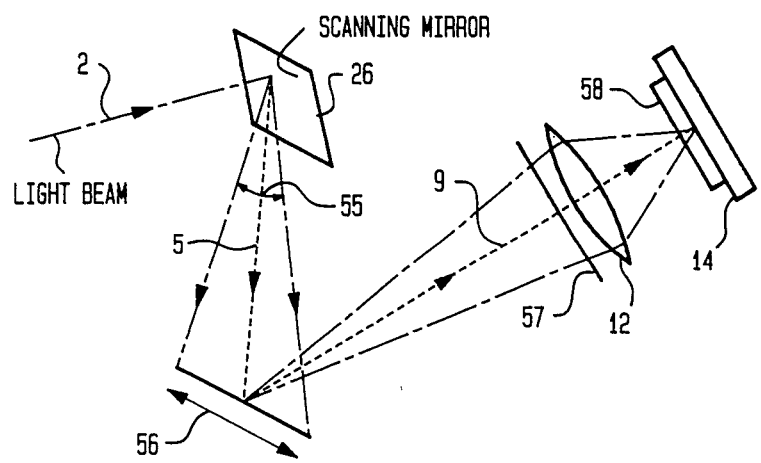
FIG. 7 is a schematic view of a structured light beam arrangement utilizing scanning.

FIG. 7 illustrates a schematic representation of the arrangement for the structured light. In this arrangement, a scanning mirror 26 oscillates through an arc 55 driven by suitable electromechanical means to scan spac 56 of the printed circuit board being inspected. A typical path for the scanning beam is illustrated by rays of light 5 and 9 which impinges on an interference filter 57 travels through the lens 12 and a ramp filter 58 on to the detector 14.

In addition to the scanning mirror 26, FIG. 7 features an arrangement which enables simplification of the detector 14 to a single cell large area integrating unit. The first element in the detecting arrangement is the filter 57 which is an interference filter that serves as a narrow bandpass filter whose passband corresponds to the lasing frequency of laser 18. The filter 57 blocks out most the ambient light while freely passing the light beam from laser 18. Next, the lens 12 images the light beam via ramp filter 58 on to detector 14. The purpose of ramp filter 58 is to convert displacement information into a corresponding variable amplitude proportionate to the amount of displacement. This conversion will be described in further detail in connection with FIGS. 9A, 9B and FIGS. 10A and 10B.

Figure 8:
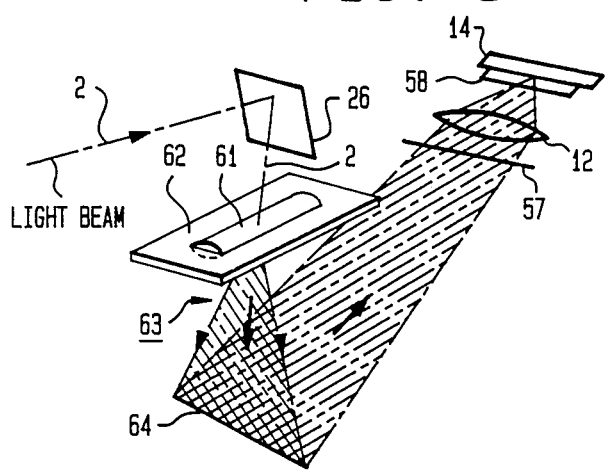
FIG. 8 depicts an alternative light beam structure arrangement.

FIG. 8 illustrates an alternative to FIG. 7 wherein the light beam 2 is converted into a fam beam of light. In other words instead of using a scanning mirror, a cylindrical lens 61 mounted in a slit in a plate 62 spreads light beam into a linear fan beam 63. This arrangement enables continuous inspection along line 64 of a printed circuit board with components mounted thereon.

Figure 9A:
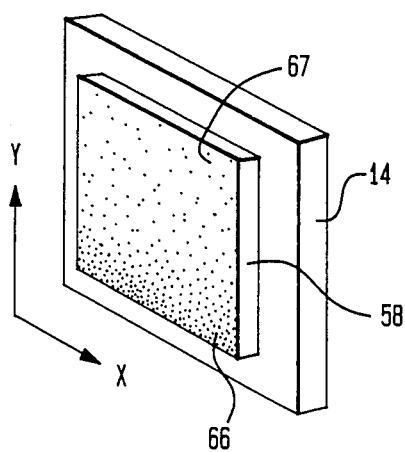
FIGS. 9A and 9B illustrate a ramp filter and its transmittance characteristics.
Figure 9B:
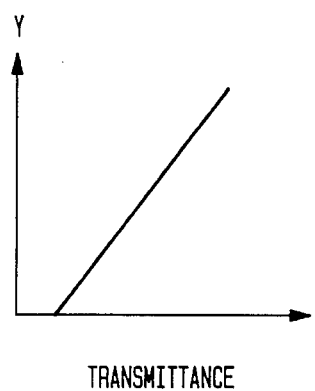

FIG. 9A shows the ramp filter 58 wherein the displacement as a function of height of the scanning operation produces movement of the received light beam along the y axis. In addition to being a neutral density filter, ramp filter 58 exhibits variable transmittance linearly along the y-axis. This property is depicted in FIG. 9B wherein low transmittance and high attenuation of the impinging light beam is produced in the region of point 66. Conversely, low attentuation and high transmittance is provided in the region of point 67. In each case, these properties vary linearly solely as a function of the location of received light beam displacement along the y-axis. Thus, the displacement along the x-axis with the y-axis displacement being constant will provide a constant amount of attenuation with the same transmittance. For this reason, ramp filter 58 translates y-axis displacement into amplitude variation.

Figure 10A:
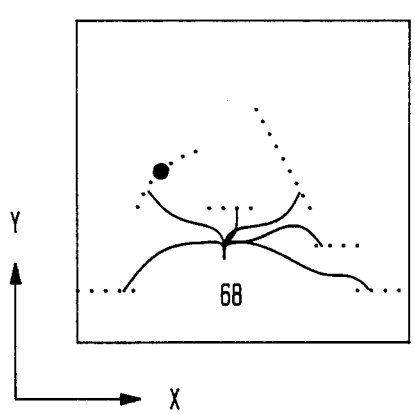
FIGS. 10A and 10B depict an integrating detector and its response.
Figure 10B:
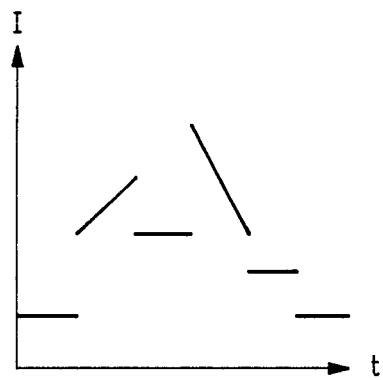

FIG. 10A depicts the path or locus of the received light spot beam with lines 68 on the planar surface (image plane) of the detector 14. When the received light beam passes through ramp filter 58 the received amount of light at the detector varys in power so the detector produces an output whose intensity output varies as a function of time. FIG. 10B depicts the output of the detector 14.

It should be pointed out that since the detector 14 integrates all the light it receives, the interference filter 57 blocks out most of the ambient light except for the portion which corresponds tot he frequency of the light beam. Even though there is still one ambient light received by the detector 14, it only produces a constant bias in the one-dimensional range signal at the output of the detector.

Another consideration in using range information encoded into intensity is the affect of the variation of the reflectivity of the object surface. Such variations are capable of also changing intensity and producing unreliable results in the output of the detector. The arrangement presented in FIG. 11 addresses this consideration.

Figure 11:
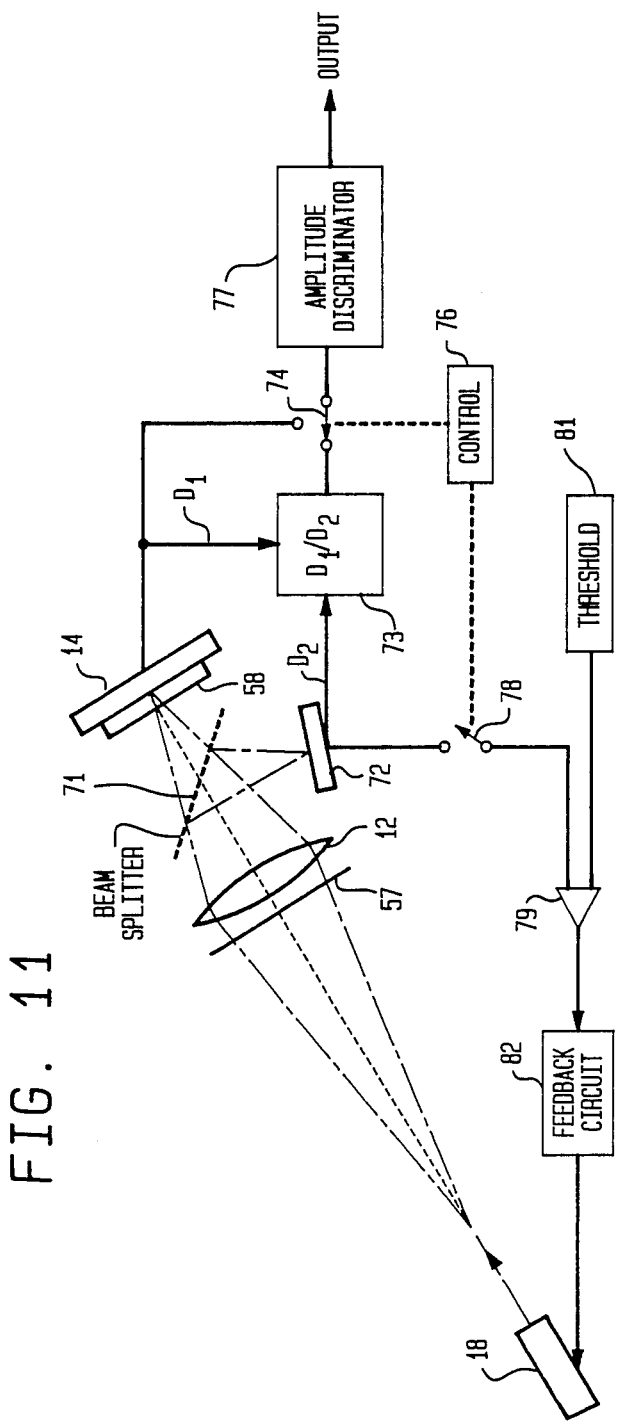
FIG. 11 depicts a dual detector arrangement which compensates for variations in the object surface reflectivity.

In FIG. 11, a beam splitter 71 extracts a portion of the input light to the detector 14 and directs this portion onto detector 72. Thus, the output of the detector 72 indicates a measure of the intensity of the light input to the detector 14. This signal quantity from detector 72 may be used in either one of two ways.

First, the outputs of both detectors 14 and 72 may be fed into divider 73 wherein the output of the detector 72 ($D_2$) is divided into the output of the detector 14 ($D_1$). This has a normalization affect wherein the ratio output is only a function of the y-axis displacement. A switch 74 directed by control 76 feeds the output of divider 73 into an amplitude discriminator 77 which may produce an alarm signal when its input does not correspond to a retained standard signal indicative of a model pointed circuit board with correctly placed components thereon.

Second, the output of the detector 72 maybe used as a feedback signal to vary the output of laser 19 to produce a constant input into the detector 14. In this mode of operation, control 76 changes the position of switch 74 and another switch 78. Now, the output of the detector 72 is applied to one input of comparator 79 while the output of the detector 14 is applied directly to the amplitude discriminator 77 via the switch 74. Due to the operation comparator 79 whose output indicates the strength of ouptut of the detector 72 in relation to a level supplied by threshold circuit 81. The output of the comparator 79 is applied to a feedback circuit 82 whose output controls the intensity of the output of the laser 18. Accordingly, the output amplitude or intensity signal produced by the detector 14 is only a function of y-axis displacement indicative of the height of components present on the printed circuit board being variable inspected.

Since the arrangement of FIG. 11 presents two different arrangements for compensation, it should be readily apparent to those working in the art that in a given application of the inventive principles that only one arrangement is advantageous and may be devised for employment.

Those skilled in the art will understand that changes can be made in the preferred embodiments here described, and that these embodiments can be used for other purposes. For instance only relative motion is required between the light beam and the printed circuit so that various arrangements may be advantageously devised wherein either only the light beam moves or only the printed circuit board moves or some portional combination of movement is provided between the two. For example, it would appear to be advantageous to impart movement to lower mass appratus with low inertia to obtain faster operation for high through-put of the inspection arrangement consistence with advanced robotic manufacturing techniques and facilities. Of course, various modifications may also be made concerning the generation and control of the light beam as well as in the detection of light beam displacement while using the inventive principles of structured light beam triangulation disclosed therein. Such changes and uses are within the scope of the invention, which is limited only by the claims which follow.

What is claimed is:

1. Apparatus for inspecting printed circuit boards comprising:
   an X-Y stage upon which a printed circuit board may be placed for inspection;
   a carriage secured to the stage and movable with respect thereto along the X direction;
   a support secured to the carriage and movable with respect thereto in the Y direction;

means for directing a light beam towards the stage, said directing means being fixed to the support;

means for detecting displacement of a light beam reflected by a body on the stage, said detecting means being fixed to the support, the detecting means comprising an integrating photodetector and a ramp filter disposed between the photodetector and the reflected light beam, the ramp filter having a variable transmittance characteristic along one direction on its surface which converts displacement of the reflected light beam into intensity variation so that the photodetector comprises a single cell structure whose light receiving area has at least one dimension corresponding to amount of displacement of the reflected light beam; and means for coupling said directing means with a source of collimated light.

2. The apparatus of claim 1, wherein said coupling means includes a mirror which is fixed with respect to the carriage.

3. Apparatus in accordance with claim 1, wherein the means for directing the light beam comprises a pivotally movable mirror for scanning the light beam linearly along the surface of the printed circuit board.

4. Apparatus for inspecting the profile of a printed circuit board having components present on at least one side, the appratus comprising:

illumination means for producing a beam of collimated light;

aiming means for directing the beam to be incident on the one side of the printed circuit board; and detecting means for detecting variations in the overall profile as a function of incidence illumination above the surface plane of the circuit board, the detecting means comprising an integrating photodetector having a predetermined single cell light receiving area, and a ramp filter with variable transmittance along one direction on its surface, the ramp filter located in front of the integrating photodetector and translating variations in the location of the reflected light along the one direction into intensity variations.

5. Apparatus according to claim 4, wherein the detecting means receives reflected light from the incidence illumination at an oblique angle with respect to the surface plane.

6. Apparatus according to claim 4, wherein a beam splitter directs a portion of the reflected light traveling toward the photodetector, and a second photodetector for receiving the portion of the reflected light and producing a level output indicative of intensity.

7. Apparatus according to claim 6, wherein a divider receives the output of the photodetector and the level output for dividing into output of the photodetector and producing an output independent of variations in surface reflectivity at the location of incidence illumination.

8. Apparatus according to claim 6, wherein feedback means, receives the level output, for controlling the output power of illumination means to compensate for variations in surface reflectivity at the location of incidence illumination.

9. Apparatus according to claim 8, further comprising dividing means, receiving the output of the photodetector and the level output, for dividing the output by the level output to produce a normalized output independent of variations in intensity of the reflected light beam, and switching means for selecting the normalized output or the output of the photodetector as the final output, the switching means being capable of disabling the operation of feedback means when the normalized output is selected.

* * * * *